United States Patent
Cyrusian (10) Patent No.: US 7,701,377 B1
(45) Date of Patent: *Apr. 20, 2010

(54) CURRENT STEERING DAC USING THIN OXIDE DEVICES

(75) Inventor: Sasan Cyrusian, Scotts Valley, CA (US)

(73) Assignee: Marvell International Ltd. (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/140,952

(22) Filed: Jun. 17, 2008

Related U.S. Application Data (63) Continuation of application No. 11/528,176, filed on Sep. 26, 2006, now Pat. No. 7,388,531.

(51) Int. Cl.
*H03M 1/34* (2006.01)

(52) U.S. Cl. ............... 341/163; 341/144; 326/93

(58) Field of Classification Search ............ 341/144, 341/155, 156, 136, 163; 330/259; 329/93
See application file for complete search history.

(56) References Cited

U.S. PATENT DOCUMENTS

| | | | |
|---|---|---|---|
| 6,018,253 A | 1/2000 | Wendell | |
| 6,784,820 B1 | 8/2004 | Casalegno et al. | |
| 7,129,745 B2 * | 10/2006 | Lewis et al. | 326/38 |
| 7,355,437 B2 * | 4/2008 | Perisetty | 326/14 |
| 2002/0044076 A1 | 4/2002 | Yao et al. | |
| 2005/0218986 A1 | 10/2005 | Garlepp et al. | |

* cited by examiner

*Primary Examiner*—Jean B Jeanglaude (57) ABSTRACT

A current steering circuit includes a multitude of current stages each including an associated current source transistor, and first and second cascode transistors coupled in series with the associated current source transistor. The first and second cascode transistors respectively receive first and second reference voltages and are biased such that a voltage appearing across any terminal pairs of the transistors is less than a predefined value. Each current stage includes a first switch supplying the current flowing through the transistors to a first resistive load in response to a control signal, and a second switch supplying the current to a second resistive load in response to a complement of the control signal. An amplifier responsive to an analog multiplexer's output provides a biasing voltage to each of the current stages. The analog multiplexer supplies a different output voltage in response to different counts of a counter.

34 Claims, 9 Drawing Sheets

CURRENT STEERING DAC USING THIN OXIDE DEVICES

CROSS-REFERENCES TO RELATED APPLICATION

The present application is a continuation application of commonly-assigned U.S. patent application Ser. No. 11/528,176 (now U.S. Pat. No. 7,388,531), filed Sep. 26, 2006, which is herein incorporated by reference in its entirety.

BACKGROUND OF THE INVENTION

The present invention relates to electronic circuits, and more particularly to current steering digital to analog converters.

Figure 1:
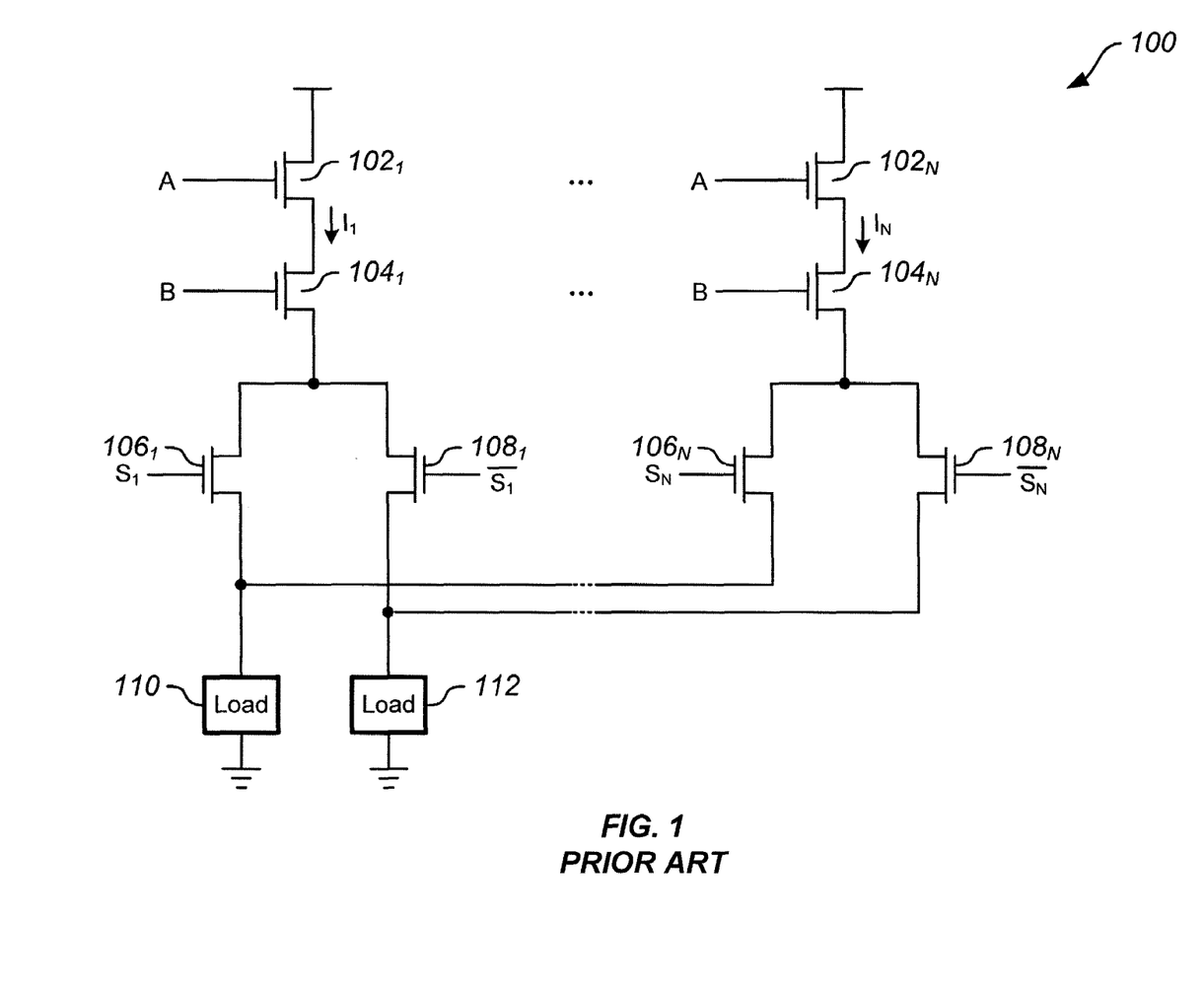
FIG. 1 is a schematic diagram of a current steering DAC, as known in the prior art.

As is widely known, a digital to analog converter (DAC), operating on the current steering principle, generates a set of binary weighted currents and selectively sums the generated currents to provide an analog output signal. FIG. 1 is a schematic diagram of a conventional N-bit current steering DAC 100, only two of the current stages of which are shown. Current sources 1021, ... 102N generate currents I1, ... IN that, depending on code signals S1, ... SN and their complements $\overline{S}_1 \ldots \overline{S}_N$, are steered either through resistive load 110 or resistive load 112.

As the integrated circuit processing technology scales down and transistor sizes are reduced, the voltages across many of terminals of the transistors shown in FIG. 1 begin to exceed the maximum allowable limits. Therefore, it would be desirable to have a current-steering DAC that can safely operate with existing supply voltages, for example, 3.3 volts, using transistors that have smaller physical dimensions, for example, smaller channel lengths, thinner gate oxides, etc.

BRIEF SUMMARY OF THE INVENTION

In accordance with one embodiment of the present invention, a current steering circuit includes, in part, a current stage that further includes, in part, a current source transistors, a first cascode transistor coupled in series with the first transistor, and a second cascode transistor coupled in series with the first cascode transistor. The first and second cascode transistors respectively receive first and second reference voltages and are biased such that a voltage appearing across any terminal pairs of any of the transistors does not exceed a predefined value.

The current stage includes a first switch adapted to pass the current flowing through the cascode transistors to a first resistive load in response to a control signal, and a second switch adapted to pass the current flowing through the cascode transistors to a second resistive load in response to a complement of the control signal.

Some embodiment of the present invention also include, in part, a multiplexer; and an amplifier responsive to the multiplexer's output to provide a biasing voltage to the current stage. Some embodiment of the present invention also include, in part, a counter configured to increment or decrement its count with each transition of a clock signal. In response to each count of the counter, the multiplexer supplies a different output voltage. Such embodiments optionally include a decoder responsive to the counter to provide one or more decoded voltages.

In some embodiments, the first switch is disposed in series with a first resistive load, and the second switch is disposed in series with a second resistive load. Each of the first and second resistive loads may be an internal resistor, or alternatively, a resistor external to a semiconductor substrate in which the current steering circuit is disposed.

In some embodiments, the current steering circuit further includes, in part, a second current stage that, in turn, includes a second current source transistor, a third cascode transistor coupled in series with the second transistor, and a fourth cascode transistor coupled in series with the third cascode transistor. The third and fourth cascode transistors respectively receive the first and second reference voltages and are biased such that a voltage present across any terminal pairs of these transistors does not exceed the predefined value.

The second current stage may further include a third switch adapted to pass the current flowing through the third and fourth cascode transistors to the first resistive load in response to a second control signal, and a fourth switch adapted to pass the current flowing through the third and fourth cascode transistors to the second resistive load in response to a complement of the second control signal.

In some embodiments, the first, second, third and fourth switches are transistor switches and the first and second control signals represent bits of a binary code. Some embodiments further include a third transistor having a gate terminal receiving the output of the amplifier, a source terminal coupled to a first voltage supply, and a drain terminal coupled to the source terminals of the first and second transistors.

In accordance with another embodiment of the present invention, a method of steering current includes, in part, biasing a first transistor to generate a first current, providing a first cascode transistor in communication with the first transistor, applying a first reference voltage to the first cascode transistor, providing a second cascode transistor in communication with the first cascode transistor; and applying a second reference voltage to the second cascode transistor such that a voltage appearing across any terminal pairs of any of these transistors does not exceed a predefined value.

The current steering method, in accordance with some embodiments of the present invention further include, passing the first current through a first switch in response to a first control signal, and passing the first current through a second switch in response to a complement of the first control signal. The current steering method of the present invention further includes supplying an increasing bias voltage to the first transistor during different cycles of a clock signal while operating in a start-up phase. The bias voltage is optionally increased in response to a counter's count. The counter's count is optionally decoded to generate one or more decoded signals.

The current steering method further includes passing the first current through a first resistive load in response to the first control signal; and passing the first current through a second resistive load in response to the complement of the first control signal. Each of said first and second resistive loads may be internally or externally supplied.

In accordance with some embodiments, the method of steering current further includes biasing a second transistor to generate a second current; providing a third cascode transistor in communication with the second transistor; applying the first reference voltage to the third cascode transistor; providing a fourth cascode transistor in communication with the third cascode transistor; and applying the second reference voltage to the fourth cascode transistor such that a voltage present across any terminal pairs of the second transistor and the third and fourth cascode transistors does not exceed the predefined value.

The current steering method further includes passing the second current through the first resistive load in response to a second control signal; and passing the second current through the second resistive load in response to a complement of the second control signal. The first and second control signals represent bits of a binary code. The current steering method further includes supplying an increasing bias voltage to the first and second transistors during different cycles of a clock signal while operating in a start-up phase. The bias voltage may be increased in a step-wise manner.

In accordance with another embodiment of the present invention, a current steering circuit includes, in part, means for biasing a first transistor to generate a first current, means for providing a first cascode transistor in communication with the first transistor, means for applying a first reference voltage to the first cascode transistor, means for providing a second cascode transistor in communication with the first cascode transistor; and means for applying a second reference voltage to the second cascode transistor such that a voltage appearing across any terminal pairs of any of the transistor does not exceed a predefined value.

The current steering circuit, in accordance with some embodiments of the present invention further includes, means for passing the first current through a first switch in response to a first control signal, and means for passing the first current through a second switch in response to a complement of the first control signal. The current steering circuit of the present invention further include means for supplying an increasing bias voltage to the first transistor during different cycles of a clock signal while operating in a start-up phase. The bias voltage is optionally increased in response to a means adapted to generate different counts. The current steering circuit further includes means for decoding the different counts.

The current steering circuit further includes means for passing the first current through a first resistive load in response to the first control signal; and means for passing the second current through a second resistive load in response to the complement of the first control signal. Each of said first and second resistive loads may be internally or externally supplied.

In accordance with some embodiments, the current steering circuit further includes means for biasing a second transistor to generate a second current; means for providing a third cascode transistor in communication with the second transistor; means for applying the first reference voltage to the third cascode transistor; means for providing a fourth cascode transistor in communication with the third cascode transistor; and means for applying the second reference voltage to the fourth cascode transistor such that a voltage appearing across any terminal pairs of the second transistor and the third and fourth cascode transistors does not exceed the predefined value.

The current steering circuit further includes means for passing the second current through the first resistive load in response to a second control signal; and means for passing the second current through the second resistive load in response to a complement of the second control signal. The first and second control signals represent bits of a binary code. The current steering circuit further includes means for supplying an increasing bias voltage to the first and second transistors during different cycles of a clock signal while operating in a start-up phase. The bias voltage may be increased in a step-wise manner.

DETAILED DESCRIPTION OF THE DRAWINGS
AND THE PRESENTLY PREFERRED
EMBODIMENTS

Figure 2A:
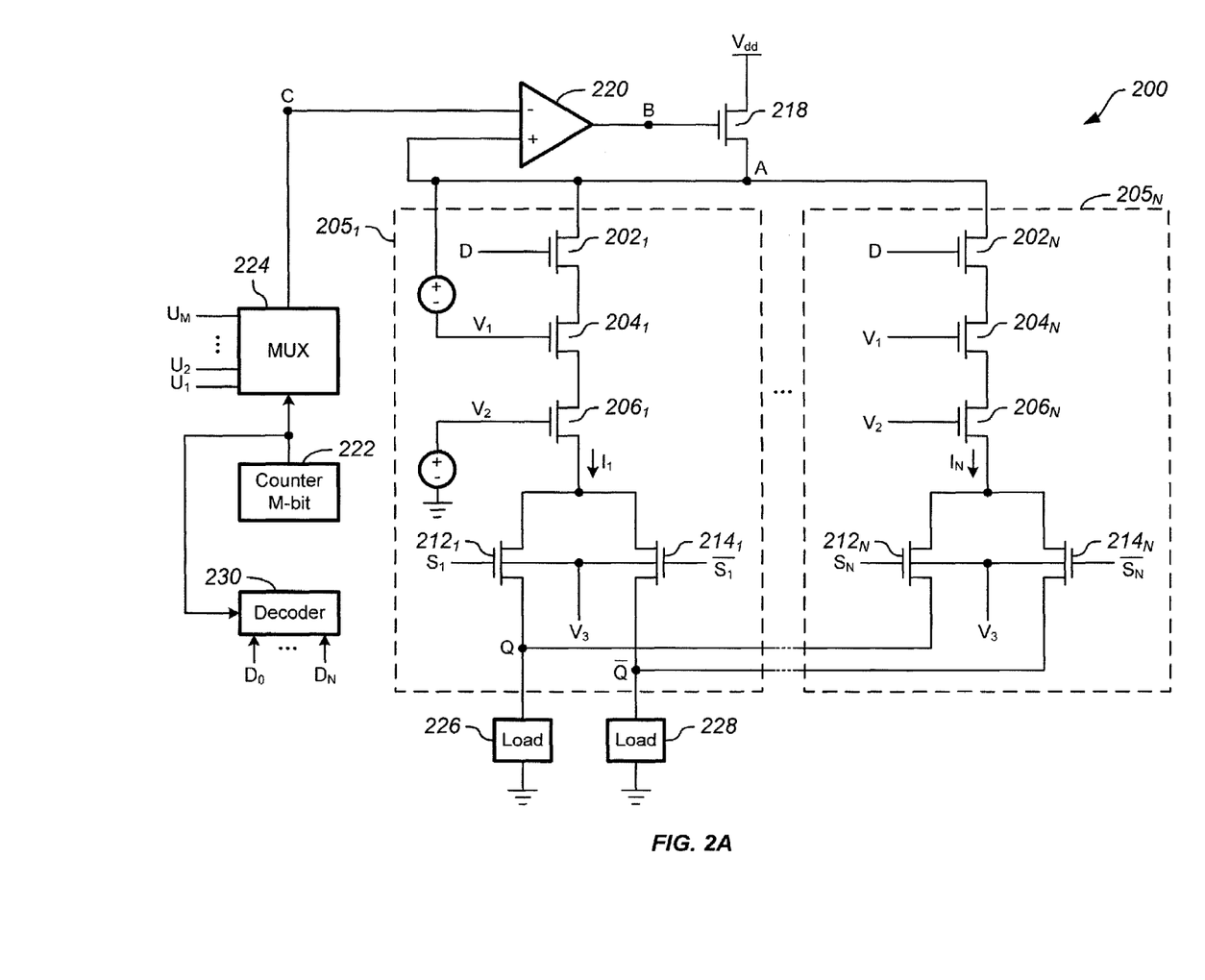
FIG. 2A is a schematic diagram of a current steering DAC, in accordance with one embodiment of the present invention.

FIG. 2A is a schematic diagram of a current steering DAC 200, in accordance with one embodiment of the present invention. Current steering DAC 200 includes, in part, N current generating stages $205_1$, $205_2$ ... $205_N$. Each current generating stage $205_i$ includes, in part, a current source $202_i$, a first cascode transistor $204_i$ and a second cascode transistor $206_i$, where i is an integer varying from 1 to N. Each current generating stage $205_i$ also includes a first transistor switch $212_i$ responsive to a first control signal $S_i$ and a second transistor switch $214_i$ responsive to a second control signal that is a complement of control signal $S_i$.

When signal $S_i$ is at a first logic state, e.g., low logic state, transistor $212_i$ is on and transistor $214_i$ is off, thereby causing current $I_i$ to flow through load 226. Conversely, when signal $S_i$ is at a second logic level, e.g., high logic state, transistor $212_i$ is off and transistor $214_i$ is on, thereby causing current $I_i$ to flow through load 228. Accordingly, during the operation, each current stage $205_i$ supplies current $I_i$ to either load 226 or 228. Nodes Q and $\overline{Q}$, that are respectively coupled to loads 226 and 228, carry complementary output signals of DAC 200. In some applications, only one of the output signals, either Q or $\overline{Q}$, may be used. In yet other applications, both output signals Q and $\overline{Q}$ are used. The transistors disposed in the exemplary embodiment of current steering DAC 200 of FIG. 2A are PMOS transistors. It is understood that other embodiments of the current steering DAC of the present invention may include NMOS transistors.

Figure 2B:
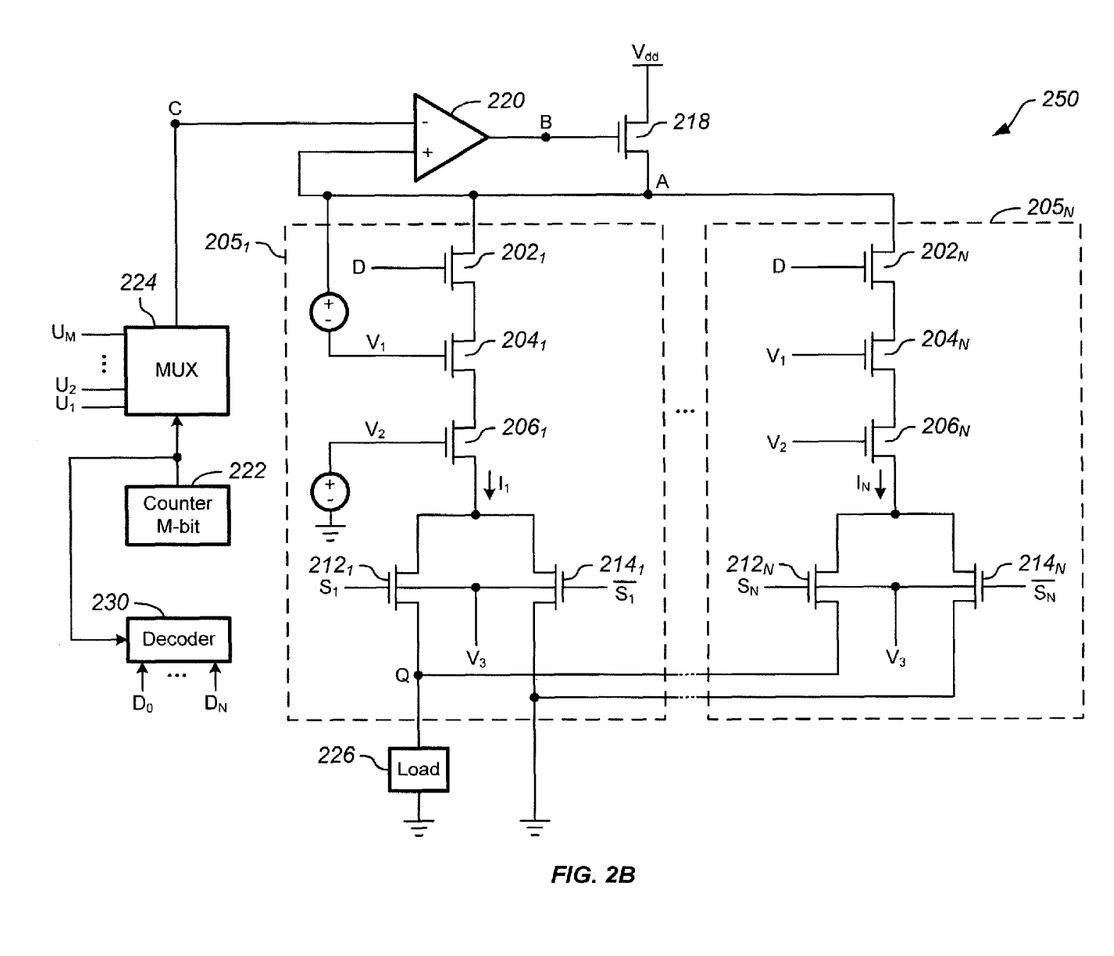
FIG. 2B is a schematic diagram of a current steering DAC, in accordance with one embodiment of the present invention.

FIG. 2B is a schematic diagram of a current steering DAC 250, in accordance with another embodiment of the present invention. Current steering DAC 250 is similar to current steering DAC 200 except that current steering DAC 250 does not include second load 228. Accordingly, in current steering DAC 250, the source terminal of transistor 214, is coupled directly to the ground terminal. Node Q provides the single output voltage of current steering DAC 250.

Each cascode transistor $204_i$ is adapted to prevent the drain-to-source voltage of its associated current source transistor $202_i$ from exceeding a predefined value. Similarly, each cascode transistor $206_i$ is adapted to prevent the drain-to-source voltage of its associated cascode transistor $204_i$ from exceeding the predefined value. To achieve this, the gate terminals of transistors $204_i$ and $206_i$ respectively receive reference voltages $V_1$ and $V_2$.

Figure 3:
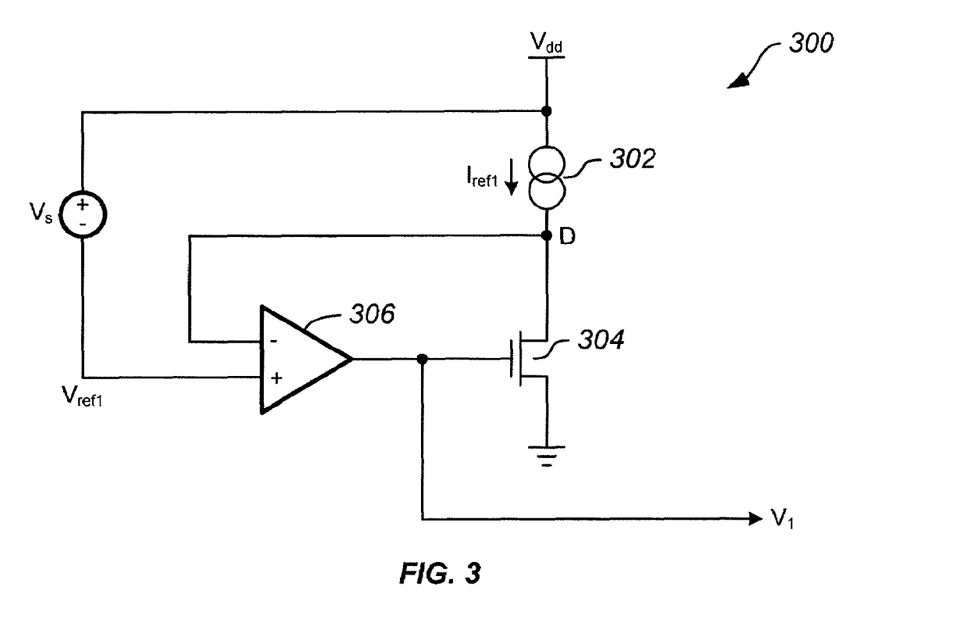
FIG. 3 is a schematic diagram of a reference voltage generator used in the current steering DACs of FIGS. 2A and 2B, in accordance with one embodiment of the present invention.

FIG. 3 is a schematic diagram of a reference voltage generator 300 adapted to generate reference voltage $V_1$, in accordance with one embodiment of the present invention. Voltage generator 300 is shown as including, in part, current source 302, amplifier 306 and transistor 304. The voltage supplied by voltage source VS is selected such that voltage $V_{ref1}$ received by the positive input terminal of amplifier 306 is substantially equal to the maximum voltage drop appearing across the drain-to-source terminals of the transistors in current steering DAC 200.

The voltages at the input terminals of amplifier 306 are substantially equal to one another. Thus, the voltage at node D coupled to the negative input terminal of amplifier 306 is also substantially equal to voltage $V_{ref1}$. Transistor 304 matches transistors $204_i$ and thus has the same physical dimensions as transistors $204_i$. In some embodiments, current source 302 may be formed using a single transistor, such as current source transistors $202_i$, shown in FIGS. 2A and 2B. In other embodiments, current source 302 may be a cascode current source. Voltage source $V_s$ may be supplied by, for example, a bandgap reference voltage generator.

Figure 4:
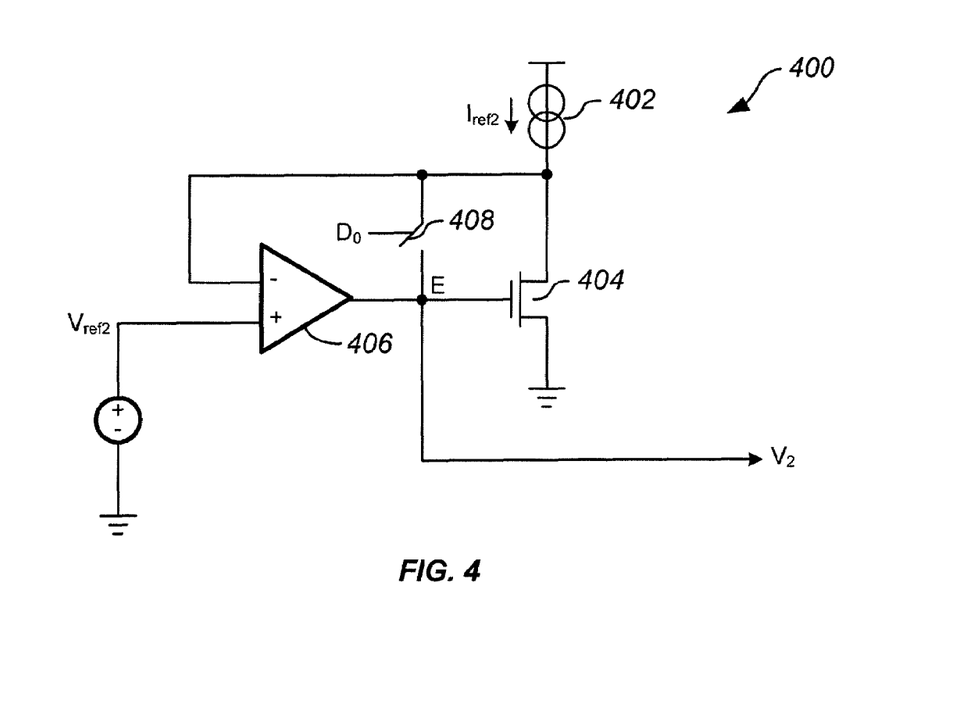
FIG. 4 is a schematic diagram of a reference voltage generator used in the current steering DACs of FIGS. 2A and 2B, in accordance with another embodiment of the present invention.

FIG. 4 is a schematic diagram of a reference voltage generator 400 adapted to generate reference voltage $V_2$, in accordance with one embodiment of the present invention. Voltage generator 400 is shown as including, in part, current source 402, amplifier 406 and transistor 404. Amplifier 406 supplies voltage $V_2$, as shown.

The bulk terminals of transistors $212_i$ and $214_i$ receive voltage $V_3$ in order to prevent the bulk-to-source or bulk-to-drain junctions of these transistors to be forward biased. Voltage source $V_3$ may be generated using, for example, a bandgap reference voltage generator. Resistive loads 226 and 228 may be internal resistors, for example, they may be polysilicon resistors. In other embodiments, resistive loads 226 and 228 may be, for example, external resistors connected to the pads of the integrated circuit in which DAC 200 is disposed.

In one exemplary embodiment, if the supply voltage Vdd is, for example, 3.6 volts, and drain-to-source terminals of any of the transistors in current steering DAC 200 is designed not to exceed, for example, 1.2 volts, voltage $V_{ref1}$ is substantially equal to, for example, 1.2 volts. In such embodiments, the voltage at node D as well as the voltage at the gate terminal of transistor 304 are substantially equal to, for example, 1.2 volts. Furthermore, in such embodiments, voltage $V_3$ applied to the bulk terminals of transistors $212_i$ and $214_i$ may be equal to, for example, 1.4 volts.

As shown in FIG. 2A, current steering DAC 200 is also shown as including, in part, transistor 218, amplifier 220, analog multiplexer 224, and counter 222, which are collectively adapted to ensure that during the startup phase, the voltages of the various nodes in current stages $205_1 \ldots 205_N$ do not exceed predefined limits, as described further below.

Figure 5:
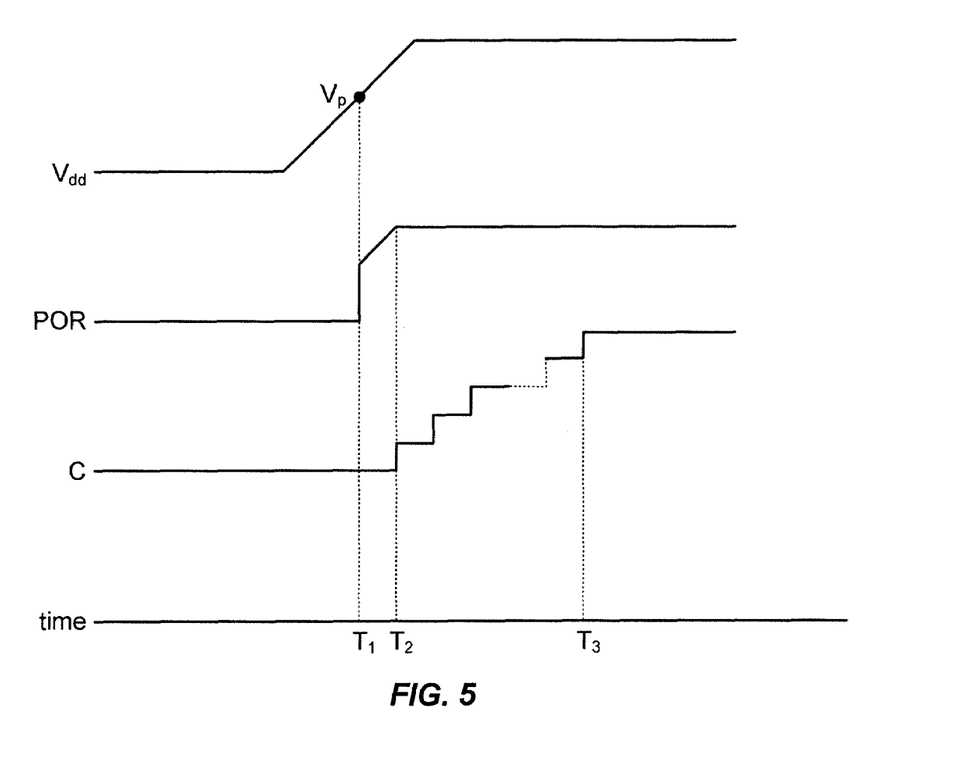
FIG. 5 is a timing diagram of a number of signals associated with the current steering DACs of FIGS. 2A and 2B, in accordance with one embodiment of the present invention.

FIG. 5 is a timing diagram of supply voltage Vdd, power-on reset signal POR, as well as the output voltage of multiplexer 224, i.e., the voltage at node C, during the start-up phase. When supply voltage Vdd reaches voltage level Vp, signal POR generated by a power-on reset circuit (not shown) starts to increase, thereby causing counter 222 and multiplexer 224 to start operation. Exemplary embodiment of counter 222 is shown as being an M-bit binary counter adapted to increment or decrement its count during each clock period, for example, 50 microseconds. Exemplary embodiment of multiplexer 224 is shown as including M input terminals each receiving a different one of the M input voltages $U_j$, wherein j is an integer varying from 1 to M. In one embodiment, the difference between voltages $U_j$ and $U_{j-1}$, i.e., $(U_j-U_{j-1})$, is the same for all js ranging from 1 to M.

With each clock cycle, counter 222 increments or decrements its count, thereby causing multiplexer 224 to output a different one of the M voltages it receives to node C in an increasing fashion, shown as stepwise in the exemplary FIG. 5. Amplifier 220 is adapted to maintain substantially equal voltages across its input terminals. Accordingly, the voltage at node A also increases gradually and in the same stepwise fashion as shown with respect to node C. Because the voltage at node A, in accordance with the present invention, is adapted to increase gradually during the start-up phase, the various nodes disposed in current stages $205_1 \ldots 205_N$ are provided with sufficient time to settle to their new values so as to inhibit the voltage across any terminal pairs of any of the transistors disposed in current stages $205_1 \ldots 205_N$ to exceed predefined values. In other words, during the time period $(T_3-T_1)$ shown in FIG. 5, transistor 218 receives its gate voltage in a controlled manner in order to ensure that the transistors disposed in current stages $205_1 \ldots 205_N$ do not receive excessively high voltages. After time $T_3$, node A is supplied with full Vdd voltage.

In one embodiment, M may be equal to, for example, 16 and voltage $U_1$, may be equal to, for example, 1.2 volts, and voltage $(U_j-U_{j-1})$, may be equal to, for example, 150 milivolts. Consequently, when counter 222 reaches a count of, for example, 16, node A receives the full Vdd value of, for example, 3.6 volts.

Some embodiments of the present invention include a decoder 230 adapted to receive counter 222's output signal and generate one or more decoded signals $D_0 \ldots D_N$ used to prevent nodes internal to DAC 200 from receiving undesirable voltages. For example, signal $D_0$ may be applied to switch 408 (FIG. 4) to clamp the negative input terminal and the output terminal of amplifier 406 during the startup phase.

Figure 6A:
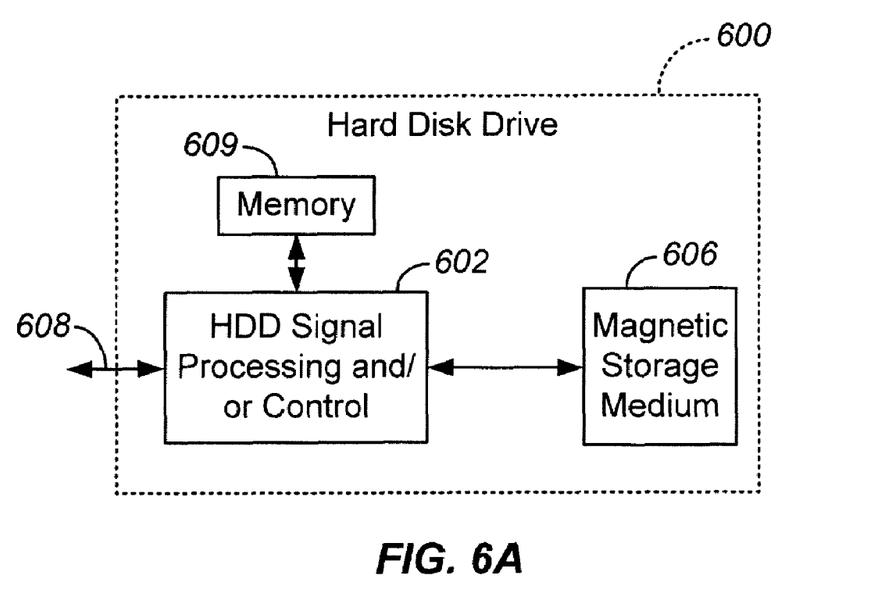
FIGS. 6A-6H show various devices in which the present invention may be embodied.

Referring now to FIGS. 6A-6G, various exemplary implementations of the present invention are shown. Referring to FIG. 6A, the present invention may be embodied in a hard disk drive (HDD) 600. The present invention may implement either or both signal processing and/or control circuits, which are generally identified in FIG. 6A at 602. In some implementations, signal processing and/or control circuit 602 and/or other circuits (not shown) in HDD 600 may process data, perform coding and/or encryption, perform calculations, and/or format data that is output to and/or received from a magnetic storage medium 606.

HDD 600 may communicate with a host device (not shown) such as a computer, mobile computing devices such as personal digital assistants, cellular phones, media or MP3 players and the like, and/or other devices via one or more wired or wireless communication links 608. HDD 600 may be connected to memory 609, such as random access memory (RAM), a low latency nonvolatile memory such as flash memory, read only memory (ROM) and/or other suitable electronic data storage.

Figure 6B:
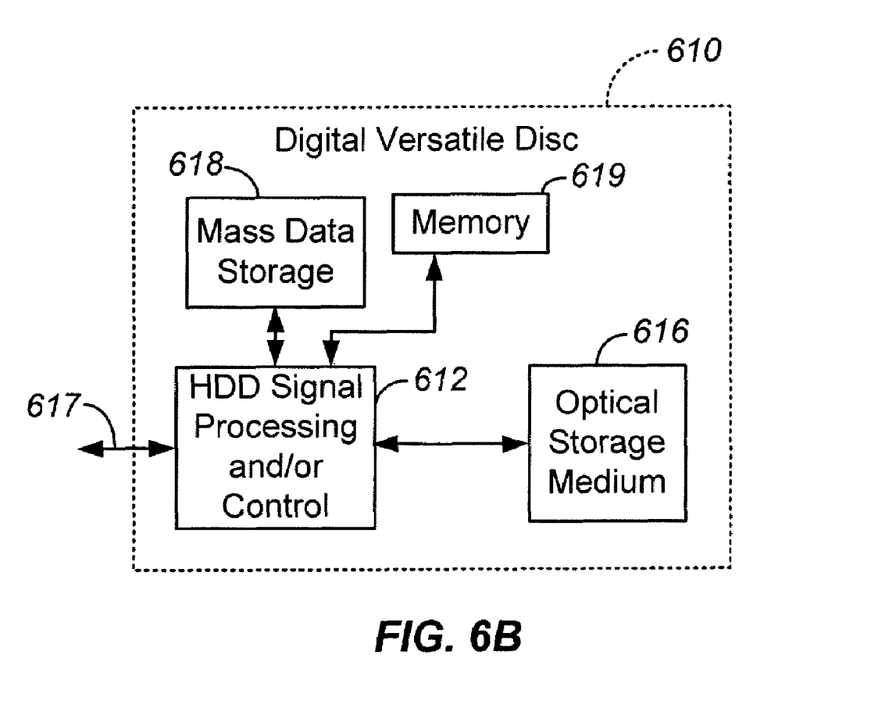

Referring now to FIG. 6B, the present invention may be embodied in a digital versatile disc (DVD) drive 610. The present invention may implement either or both signal processing and/or control circuits, which are generally identified in FIG. 6B at 612, and/or mass data storage 618 of DVD drive 610. Signal processing and/or control circuit 612 and/or other circuits (not shown) in DVD drive 610 may process data, perform coding and/or encryption, perform calculations, and/or format data that is read from and/or data written to an optical storage medium 616. In some implementations, signal processing and/or control circuit 612 and/or other circuits (not shown) in DVD drive 610 can also perform other functions such as encoding and/or decoding and/or any other signal processing functions associated with a DVD drive.

DVD drive 610 may communicate with an output device (not shown) such as a computer, television or other device via one or more wired or wireless communication links 617. DVD drive 610 may communicate with mass data storage 618 that stores data in a nonvolatile manner. Mass data storage

618 may include a hard disk drive (HDD) such as that shown in FIG. 6A. The HDD may be a mini HDD that includes one or more platters having a diameter that is smaller than approximately 1.8". DVD drive 610 may be connected to memory 619, such as RAM, ROM, low latency nonvolatile memory such as flash memory, and/or other suitable electronic data storage.

Figure 6C:
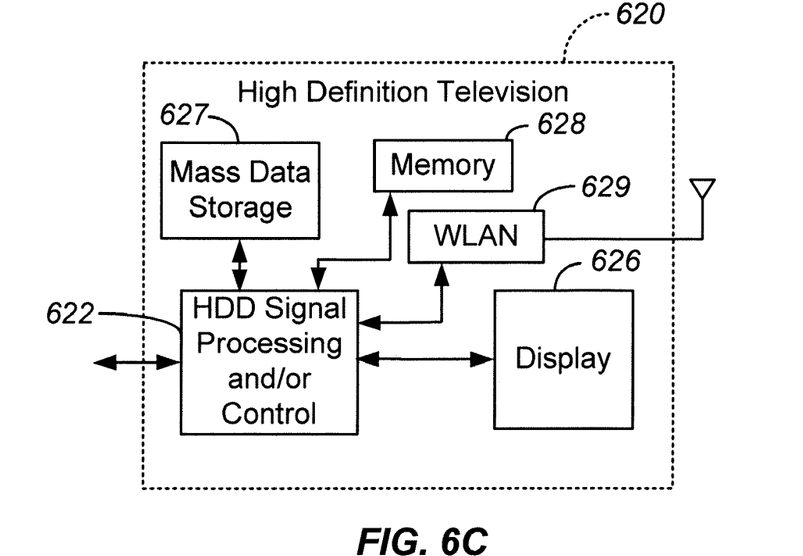

Referring now to FIG. 6C, the present invention may be embodied in a high definition television (HDTV) 620. The present invention may implement either or both signal processing and/or control circuits, which are generally identified in FIG. 6C at 622, a WLAN interface 629 and/or mass data storage 627 of the HDTV 620. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices including a HDD and a DVD drive. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via the WLAN interface 629.

Figure 6D:
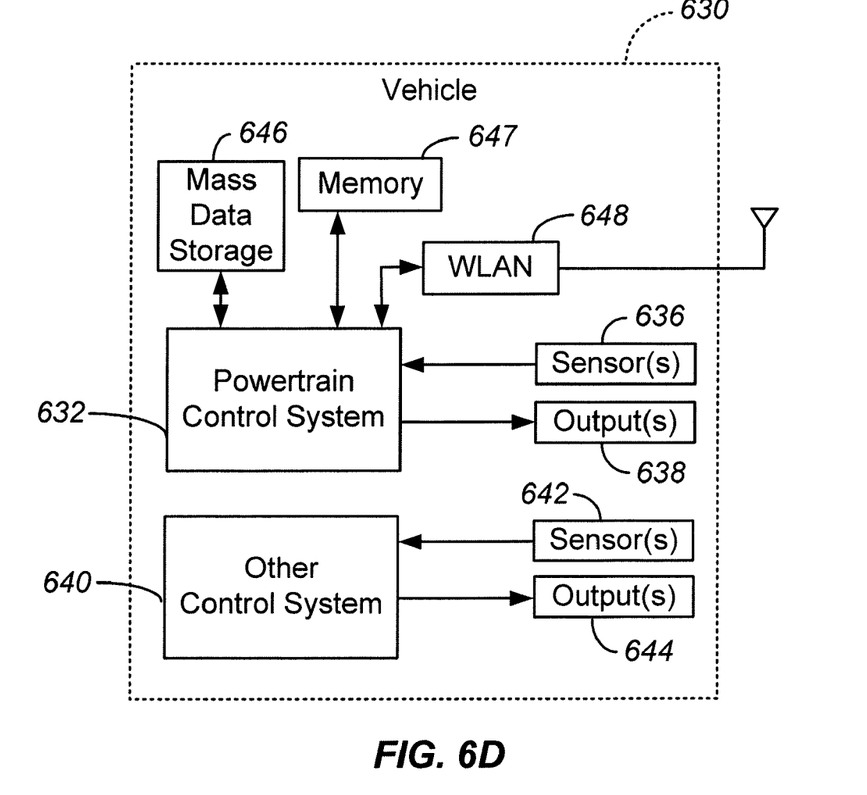

Referring now to FIG. 6D, the present invention implements a control system of a vehicle 630, a WLAN interface 648 and/or mass data storage 646 of the vehicle 630. In some implementations, the present invention implements a powertrain control system 632 that receives inputs from one or more sensors 636 such as temperature sensors, pressure sensors, rotational sensors, airflow sensors and/or any other suitable sensors and/or that generates one or more output control signals 638 such as engine operating parameters, transmission operating parameters, and/or other control signals.

The present invention may also be embodied in other control systems 640 of vehicle 630. Control system 640 may likewise receive signals from input sensors 642 and/or output control signals to one or more output devices 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices such as hard disk drives (HDDs) and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via the WLAN interface 648. The control system 640 may also include mass data storage, memory and/or a WLAN interface (all not shown).

Figure 6E:
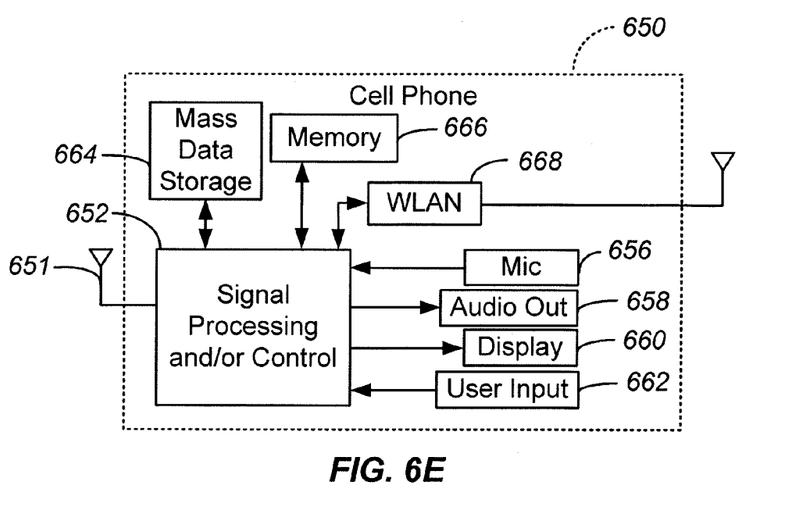

Referring now to FIG. 6E, the present invention may be embodied in a cellular phone 650 that may include a cellular antenna 651. The present invention may implement either or both signal processing and/or control circuits, which are generally identified in FIG. 6E at 652, a WLAN interface 668 and/or mass data storage 664 of the cellular phone 650. In some implementations, cellular phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Cellular phone 650 may communicate with mass data storage 664 that stores data in a nonvolatile manner such as optical and/or magnetic storage devices including hard disk drives (HDDs) and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Cellular phone 650 may be connected to memory 666 such as RAM, ROM, low latency nonvolatile memory such as flash memory and/or other suitable electronic data storage. Cellular phone 650 also may support connections with a WLAN via the WLAN interface 668.

Figure 6F:
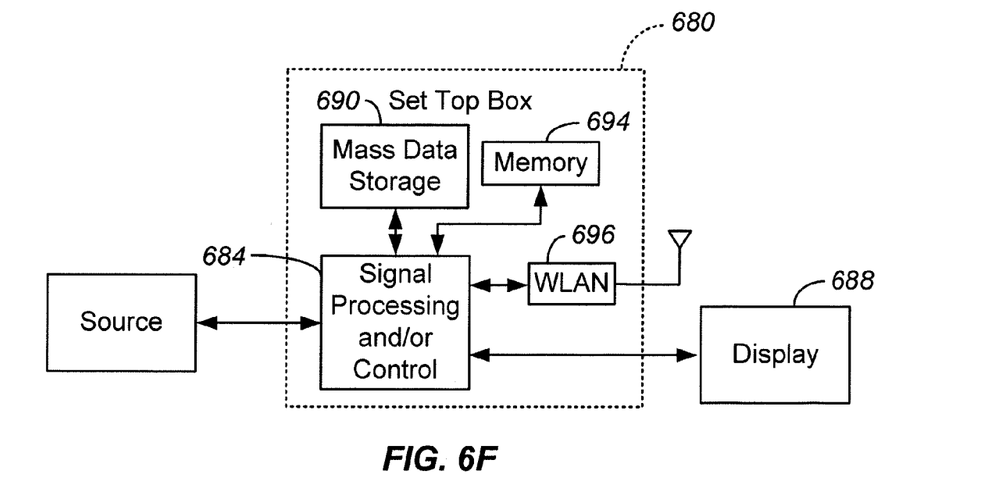

Referring now to FIG. 6F, the present invention may be embodied in a set top box 680. The present invention may implement either or both signal processing and/or control circuits, which are generally identified in FIG. 6F at 684, a WLAN interface 696 and/or mass data storage 690 of the set top box 680. Set top box 680 receives signals from a source such as a broadband source and outputs standard and/or high definition audio/video signals suitable for a display 688 such as a television, a monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices such as hard disk drives (HDDs) and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via the WLAN interface 696.

Figure 6G:
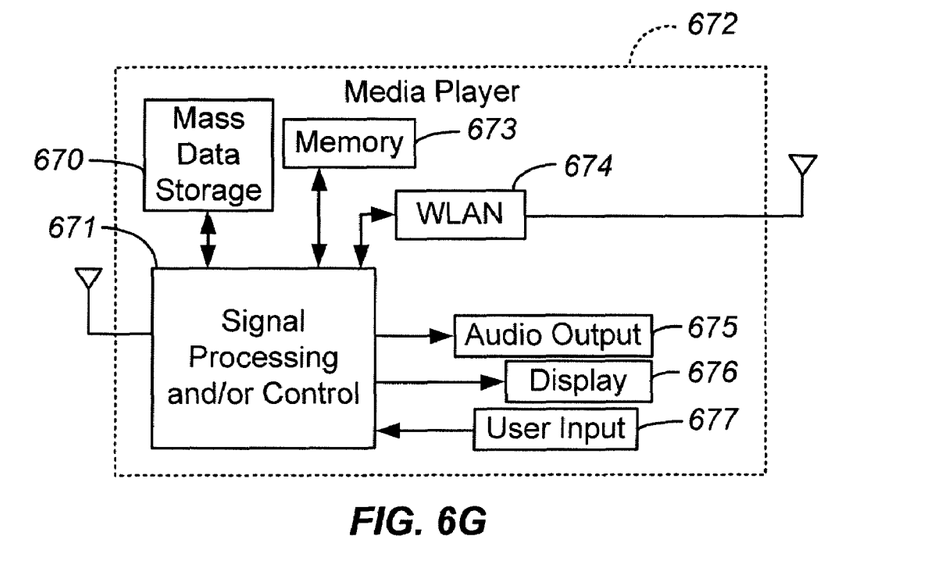

Referring now to FIG. 6G, the present invention may be embodied in a media player 672. The present invention may implement either or both signal processing and/or control circuits, which are generally identified in FIG. 6G at 671, a WLAN interface 674 and/or mass data storage 670 of the media player 672. In some implementations, media player 672 includes a display 676 and/or a user input 677 such as a keypad, touchpad and the like. In some implementations, media player 672 may employ a graphical user interface (GUI) that typically employs menus, drop down menus, icons and/or a point-and-click interface via display 676 and/or user input 677. Media player 672 further includes an audio output 675 such as a speaker and/or audio output jack. Signal processing and/or control circuits 671 and/or other circuits (not shown) of media player 672 may process data, perform coding and/or encryption, perform calculations, format data and/or perform any other media player function.

Media player 672 may communicate with mass data storage 670 that stores data such as compressed audio and/or video content in a nonvolatile manner. In some implementations, the compressed audio files include files that are compliant with MP3 format or other suitable compressed audio and/or video formats. The mass data storage 670 may include optical and/or magnetic storage devices such as hard disk drives (HDDs) and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". Media player 672 may be connected to memory 673 such as RAM, ROM, low latency nonvolatile memory such as flash memory and/or other suitable electronic data storage. Media player 672 also may support connections with a WLAN via the WLAN interface 674.

Figure 6H:
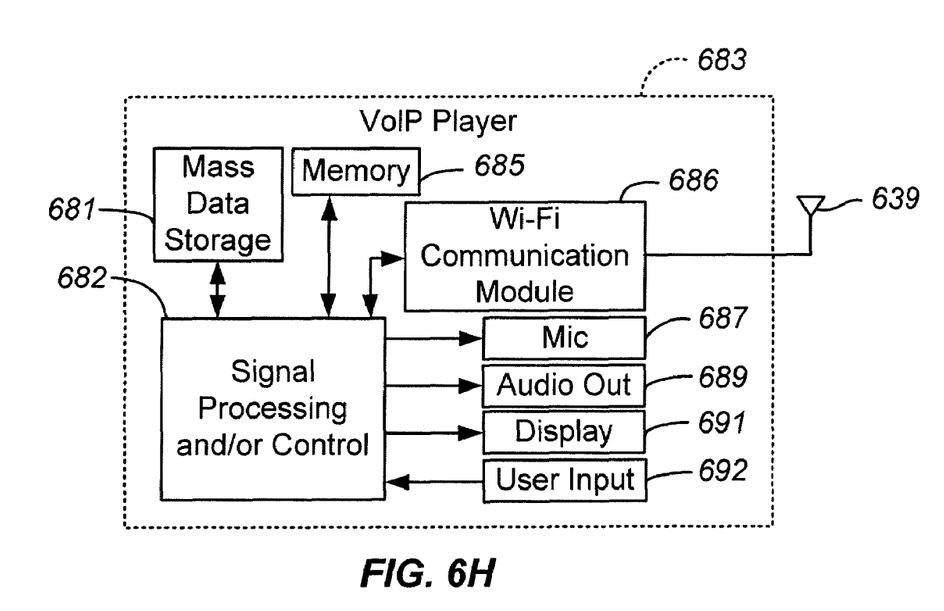

Referring now to FIG. 6H, the present invention may be embodied in a Voice over Internet Protocol (VoIP) phone 683 that may include an antenna 639. The present invention may implement either or both signal processing and/or control circuits, which are generally identified in FIG. 6H at 682, a wireless interface and/or mass data storage 681 of the VoIP phone 686. In some implementations, VoIP phone 683 includes, in part, a microphone 687, an audio output 689 such as a speaker and/or audio output jack, a display monitor 691, an input device 692 such as a keypad, pointing device, voice actuation and/or other input devices, and a Wireless Fidelity (Wi-Fi) communication module 686. Signal processing and/or control circuits 686 and/or other circuits (not shown) in VoIP phone 683 may process data, perform coding and/or encryption, perform calculations, format data and/or perform other VoIP phone functions.

VoIP phone 683 may communicate with mass data storage 681 that stores data in a nonvolatile manner such as optical and/or magnetic storage devices including hard disk drives (HDDs) and/or DVD drives. At least one HDD may have the configuration shown in FIG. 6A and/or at least one DVD drive may have the configuration shown in FIG. 6B. The HDD may be a mini HDD that includes one or more platters having a diameter that is smaller than approximately 1.8". VoIP phone 683 may be connected to memory 685, which may be a RAM, ROM, low latency nonvolatile memory such as flash memory and/or other suitable electronic data storage. VoIP phone 683 is configured to establish communications link with a VoIP network (not shown) via Wi-Fi communication module 686. Still other implementations in addition to those described above are contemplated.

The above embodiments of the present invention are illustrative and not limitative. Various alternatives and equivalents are possible. The invention is not limited by the type of amplifier, or transistor. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A current steering circuit comprising:
   a first cascode transistor in communication with a first transistor and receiving a first reference voltage; and
   a second cascode transistor in communication with the first cascode transistor and receiving a second reference voltage, said first and second cascode transistors being biased such that a voltage appearing across any terminal pairs of the first transistor and the first and second cascode transistors does not exceed a predefined value.

2. The current steering circuit of claim 1 further comprising:
   a first switch in communication with the second cascode transistor and adapted to pass a first current generated by the first transistor in response to a first control signal; and
   a second switch in communication with the second cascode transistor and adapted to pass the first current in response to a complement of the first control signal.

3. The current steering circuit of claim 1 further comprising:
   a multiplexer coupled to the first and second cascode transistors; and
   an amplifier responsive to an output of the multiplexer to provide a biasing voltage to the first transistor.

4. The current steering circuit of claim 3 further comprising:
   a counter configured to increment or decrement its count with each transition of a clock signal, said multiplexer supplying a different one of a plurality of output voltages in response to each of the counter's count.

5. The current steering circuit of claim 4 further comprising:
   a decoder responsive to the counter's count.

6. The current steering circuit of claim 2 further comprising:
   a first resistive load in communication with the first switch; and
   a second resistive load in communication with the second switch.

7. The current steering circuit of claim 6 wherein each of said first and second resistive loads is an internal resistor.

8. The current steering circuit of claim 6 wherein each of said first and second resistive loads is a resistor external to a semiconductor substrate in which the current steering circuit is formed.

9. The current steering circuit of claim 2 further comprising:
   a third cascode transistor in communication with a second transistor and receiving the first reference voltage; and
   a fourth cascode transistor in communication with the third cascode transistor and receiving the second reference voltage.

10. The current steering circuit of claim 9 further comprising:
    a third switch in communication with the fourth cascode transistor and adapted to pass a second current supplied by the second transistor in response to a second control signal; and
    a fourth switch in communication with the fourth cascode transistor and adapted to pass the second current in response to a complement of the second control signal.

11. The current steering circuit of claim 10 wherein said first, second, third and fourth switches include transistors.

12. The current steering circuit of claim 10 wherein said first and second control signals represent bits of a binary code.

13. The current steering circuit of claim 10 further comprising:

a multiplexer;

an amplifier responsive to an output of the multiplexer to provide a biasing voltage to the first transistor; and a third transistor having a gate terminal receiving the output of the amplifier, a source terminal coupled to a first voltage supply, and a drain terminal coupled to a source terminal of the first and second transistors.

14. The current steering circuit of claim 9 wherein said first and second transistors, and said first, second, third and fourth cascode transistors are MOS transistors of a first conductivity type.

15. The current steering circuit of claim 2 further comprising:

a first resistive load in communication with the first switch, wherein said second switch is in communication with a first voltage supply.

16. The current steering circuit of claim 15 wherein said first voltage supply is a ground potential.

17. A digital to analog converter incorporating the current steering circuit of claim 1.

18. A method of steering a current, the method comprising:

communicating between a first cascode transistor and a first transistor;

applying a first reference voltage to the first cascode transistor;

communicating between a second cascode transistor and the first cascode transistor; and applying a second reference voltage to the second cascode transistor such that a voltage appearing across any terminal pairs of the first transistor and the first and second cascode transistors does not exceed a predefined value.

19. The method of claim 18 further comprising:

passing a first current generated by the first transistor through a first switch in response to a first control signal; and passing the first current through a second switch in response to a complement of the first control signal.

20. The method of claim 19 further comprising:

supplying a varying bias voltage to the first transistor during different cycles of a clock signal while operating in a start-up phase.

21. The method of claim 20 wherein the bias voltage is varied in response to a counter's count.

22. The method of claim 21 further comprising:

decoding the counter's count.

23. The method of claim 19 further comprising:

passing the first current through a first resistive load in response to the first control signal; and passing the first current through a second resistive load in response to the complement of the first control signal.

24. The method of claim 23 wherein each of said first and second resistive loads is a resistor internally supplied.

25. The method of claim 23 wherein each of said first and second resistive loads is a resistor externally supplied.

26. The method of claim 23 further comprising:

communicating between a third cascode transistor and a second transistor;

applying the first reference voltage to the third cascode transistor;

communicating between a fourth cascode transistor and the third cascode transistor; and applying the second reference voltage to the fourth cascode transistor such that a voltage across any terminal pairs of the second transistor and the third and fourth cascode transistors does not exceed the predefined value.

27. The method of claim 26 further comprising:

passing a second current generated by the second transistor through the first resistive load in response to a second control signal; and passing the second current through the second resistive load in response to the complement of the second control signal.

28. The method of claim 27 wherein said first and second control signals are representative bits of a binary code.

29. The method of claim 26 further comprising:

supplying an increasing bias voltage to the first and second transistors during different cycles of a clock signal while operating in a start-up phase.

30. The method of claim 29 wherein the bias voltage is increased in a stepwise manner.

31. The method of claim 26 wherein said first and second transistors, and said first, second, third and fourth cascode transistors are MOS transistors of a first conductivity type.

32. The method of claim 18 further comprising:

passing a first current generated by the first transistor through a first switch in response to a first control signal; and passing the first current through a second switch in response to a complement of the first control signal, wherein said second switch is in communication with a first voltage supply.

33. The method of claim 32 wherein said first voltage supply is a ground potential.

34. A digital to analog converter performing the method of claim 18.

* * * * *